United States Patent
Zhang et al.

(10) Patent No.: US 9,147,855 B2
(45) Date of Patent: Sep. 29, 2015

(54) LIGHT EMITTING DIODE AND MANUFACTURING METHOD THEREOF

(71) Applicant: BOE Technology Group Co., Ltd., Beijing (CN)

(72) Inventors: Feng Zhang, Beijing (CN); Tianming Dai, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/059,767

(22) Filed: Oct. 22, 2013

(65) Prior Publication Data
US 2014/0110665 A1    Apr. 24, 2014

(30) Foreign Application Priority Data
Oct. 23, 2012   (CN) .......................... 2012 1 0407147

(51) Int. Cl.
*H01L 51/00* (2006.01)
*H01L 21/00* (2006.01)
*H01L 51/50* (2006.01)

(52) U.S. Cl.
CPC .......... *H01L 51/502* (2013.01); *H01L 51/5092* (2013.01); *H01L 51/5056* (2013.01)

(58) Field of Classification Search
CPC ........................ H01L 51/5012; H01L 51/502
See application file for complete search history.

(56) References Cited

U.S. PATENT DOCUMENTS

| | | | |
|---|---|---|---|
| 2002/0018632 A1* | 2/2002 | Pelka | 385/130 |
| 2003/0203643 A1* | 10/2003 | Hasei et al. | 438/758 |
| 2005/0236556 A1* | 10/2005 | Sargent et al. | 250/214.1 |
| 2010/0001256 A1 | 1/2010 | Coe-Sullivan et al. | |
| 2012/0068154 A1* | 3/2012 | Hwang et al. | 257/13 |
| 2013/0102084 A1* | 4/2013 | Loh et al. | 436/94 |

FOREIGN PATENT DOCUMENTS

| | | |
|---|---|---|
| CN | 1780016 A | 5/2006 |
| CN | 101559919 A | 10/2009 |
| CN | 101995402 A | 3/2011 |
| KR | 20120067158 A | 6/2012 |

OTHER PUBLICATIONS

Second Office Action (Chinese language) issued by the State Intellectual Property Office ("SIPO") for International Application No. 201210407147.3 on Feb. 27, 2015; 6 pages.
English translation of Second Office Action (listed above) issued by SIPO for International Application No. 201210407147.3 on Feb. 27, 2015; 5 pages.
English abstract of CN101559919A, listed above, 1 page.
English abstract of KR20120067158A, listed above, 1 page.
First Office Action (Chinese language) issued by the State Intellectual Property Office ("SIPO") on Nov. 26, 2014 for International Application No. 201210407147.3, 6 pages.
(Continued)

*Primary Examiner* — Victor A Mandala
*Assistant Examiner* — Quovaunda V Jefferson

(57) ABSTRACT

The embodiments of the present invention relate to a light emitting diode and manufacturing method thereof. The electroluminescent layer of the light-emitting diode is formed of graphene/compound semiconductor quantum dot composites.

6 Claims, 1 Drawing Sheet

(56) References Cited

OTHER PUBLICATIONS

English translation of first Office Action (listed above) issued by SIPO for International Application No. 201210407147.3, 3 pages.

English abstract of CN1780016A, listed above, 1 page.
English abstract of CN101995402A, listed above, 1 page.

* cited by examiner

US 9,147,855 B2

LIGHT EMITTING DIODE AND MANUFACTURING METHOD THEREOF

CROSS REFERENCE TO RELATED APPLICATIONS

This application claims priority from Chinese National Application No. 201210407147.3 filed on Oct. 23, 2012, the contents of which are incorporated herein by reference.

FIELD OF THE INVENTION

Embodiments of the present invention relate to a light emitting diode and manufacturing method thereof.

BACKGROUND

Graphene is a two-dimensional crystal composed of honeycomb-arranged carbon atoms. Due to its quantum transport properties, high electrical conductivity, electron mobility, and light transmissivity, graphene and related devices have become one of the hot topics in physics, chemistry, biology and materials science research. So far, there have appeared a variety of devices using graphene as basic functional unit, such as field effect transistors, solar cells, nano-generators, sensors, etc.

Quantum dot (referred as QD) is a semiconductor nanocrystal of which radius is less than or close to the exciton Bohr radius. As a quasi-zero-dimensional nanomaterial which is 1 to 10 nm in all three dimensions, QDs appear just like very tiny dot. Because QDs have dimensions comparable to de Broglie wavelength of electron, coherent wavelength and exciton Bohr radius, electrons in confined in a nanospace, resulting in a restricted electron transport and a rather short electron mean free path, enhanced electronic coherence and localization, which in turn brings about quantum confinement effect. Therefore, QDs exhibit many physical and chemical properties that are different from macroscopic materials. Due to their unique quantum size effect, QDs have been widely used in the field of optoelectronics, such as solar cells, light emitting devices, biomarkers.

In prior art, the electroluminescent layer of a quantum dot light emitting diode only comprises a quantum dot layer, However, due to the poor charge transport ability of quantum dots, the light emission efficiency of the light emitting diode is adversely affected.

SUMMARY

An embodiment of the present invention provides a light emitting diode comprising a substrate, a cathode, an electron transport layer, a electroluminescent layer, a hole transport layer and a transparent anode, wherein the electroluminescent layer is formed of graphene/compound semiconductor quantum dot composites.

In an example, the compound semiconductor quantum dots exist in the form of a single layer.

In an example, the graphene/compound semiconductor quantum dot composites is prepared by the following steps: mixing a graphite oxide solution with cadmium acetate dihydrate in a 1:1 molar ratio so as to obtain a mixture; uniformly dispersing the mixture in dimethylsulfoxide solution; performing ultrasonic and anneal treatments followed by washing and drying.

Another embodiment of the present invention provides a method of manufacturing a light emitting diode comprising the following steps: depositing a transparent anode layer on a substrate; dissolving graphene/compound semiconductor quantum dot composites and a material for a hole transport layer in an organic solvent; coating the surface of the transparent anode with the mixture; removing the solvent by heating so as to form a hole transport layer and a overlying electroluminescent layer formed of graphene/compound semiconductor quantum dot composites; depositing an electron transport layer; depositing a metal cathode layer.

In an example, the material for the hole transport layer is triphenyldiamine.

A further embodiment of the present invention provides a method of manufacturing a light emitting diode comprising the following steps:

depositing a metal cathode layer on a substrate;
depositing an electron transport layer;
dissolving a graphene/compound semiconductor quantum dot composites in an organic solvent so as to obtain a mixture, coat the surface of the electron transport layer with the mixture; removing the solvent by heating so as to form an electroluminescent layer of graphene/compound semiconductor quantum dot composites;
depositing a hole transport layer;
depositing a transparent anode layer.

BRIEF DESCRIPTION OF THE DRAWINGS

In order to clearly illustrate the technical solutions of the embodiments of the present invention, the accompanying drawings of the embodiments will be briefly described in the following; it is obvious that the following description of the drawings only relates to some embodiments of the invention and thus not limitative of the invention.

DETAILED DESCRIPTION

Figure 1:
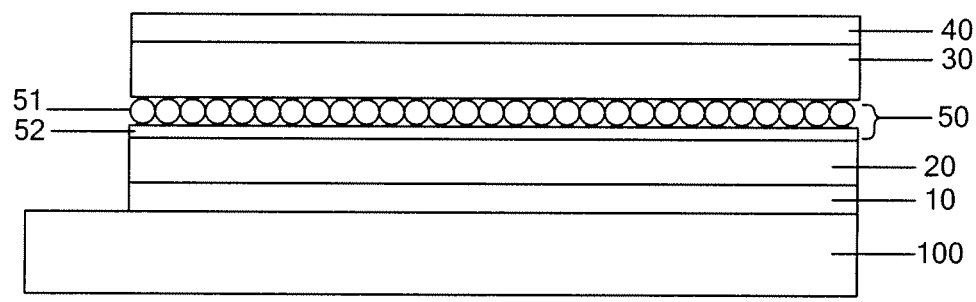
FIG. 1 is a schematic diagram showing light emitting diode manufactured in the second embodiment of the present invention.

In connection with the accompanying drawings related to the embodiments of the present invention, the technical solutions of the embodiments will be described in a clear and fully understandable way; it is obvious that the described embodiments are just one part but not all of the embodiments of the invention. Other embodiment(s) obtained by those skilled in the art, based on the embodiments of the present invention, without any inventive work, all belong to the protection scope of the present invention.

First Embodiment

The first embodiment of the present invention provides a method of preparing graphene/CdS quantum dot composites.

A certain amount of cadmium acetate dehydrate is added into a graphite oxide solution with a concentration of 0.5 mg/ml. For example, the molar ratio of cadmium acetate and graphite oxide is 1:1. Then the mixture is uniformly dispersed in dimethyl sulfoxide (DMSO) solution, wherein the dosage of the DMSO solution is determined based on the mass of the graphite oxide, for example, 1 ml dimethyl sulfoxide solution is used for dispersing each 1 mg graphite oxide; after ultrasonic treatment for 15 minutes, the mixture is transferred into a high temperature reaction kettle and annealed at 180° C. for 12 hours, then washed several times with acetone and ethanol and finally dried up to obtain the graphene/CdS quantum dot composites.

Second Embodiment

The second embodiment of the present invention provides a method of manufacturing the light emitting diode comprising a light emitting layer of graphene/compound semiconductor quantum dot composites. The method includes the following steps:
1) depositing a metal cathode 10 on the substrate 100, for example, by sputtering, vapor plating, or spin coating, etc;
2) depositing an electron transport layer 20, for example, by sputtering, vapor plating, or spin coating, etc;
3) dissolving the graphene/compound semiconductor quantum dot composites in an organic solvent such as toluene so as to obtain a mixture; coating the electron transport layer 20 with the mixture for example, by spin coating; and removing the solvent by heating, so as to form a light emitting layer 50 of graphene/compound semiconductor quantum dot composites;
4) depositing a hole transport layer 30 of triphenyldiamine on the light emitting layer 50 of graphene/compound semiconductor quantum dot composites by sputtering, vapor plating, or spin coating, etc.
5) depositing a transparent anode 40 by sputtering, vapor plating, or spin coating, etc.

Referring to FIG. 1, the light emitting diode manufactured by the method in accordance with the first embodiment of the present invention, comprises, from the bottom to the top, the substrate 100, the metal cathode 10, the electron transport layer 20, the light emitting layer 50 of the graphene/compound semiconductor quantum dot composites, the hole transport layer 30, and the transparent anode 40. The light emitting layer 50 of graphene/compound semiconductor quantum dot composites comprises a layer of compound semiconductor quantum dots 51 and a layer of graphene 52, wherein the layer of compound semiconductor QDs has a high density. Therefore, the light emitting diode comprising the light emitting layer 50 of graphene/compound semiconductor quantum dot composites has a high efficiency of light emission.

The substrate 100 can be made of materials such as glass, silica, metals, etc.

The metal cathode 10 can be made of materials such as Al, Ag, MgAg alloys, etc.

The electron transport layer 20 is used to transfer electrons to the light emitting layer 50 of graphene/compound semiconductor quantum dot composites. The electron transport layer 20 can be made of inorganic oxide materials such as ZnO, $TiO_2$, $WO_3$ or $SnO_2$, or organic materials such as TPBI (1,3,5-Tris(N-phenyl benzimidazole-2-2 yl)benzene) or TAZ (3-(4-biphenyl)-4-phenyl-5-tert-butyl-phenyl-1,2 4-triazole).

The hole transport layer 30 is used to transfer holes to the light-emitting layer 50 of graphene/compound semiconductor quantum dot composites. The hole transport layer 30 can be made of organic materials such as CBP (4,4'-N,N'-dicarbazole-biphenyl), a-NPD (N,N'-Di[(1-naphthalenyl)-N,N'-diphenyl]-1,1'-biphenyl)-4,4'-diamine), TCCA (4,4',4''-Tris (N-azolyl)-triphenylamine) and DNTPD (N,N'-Bis(4-(N,N'-diphenyl-amino)phenyl)-N,N'-diphenylbenzidine), or inorganic materials such as NiO, $MoO_3$, etc.

The transparent anode 40 is a layer of indium tin oxide (ITO).

The light emitting layer 50 of graphene/compound semiconductor quantum dot composites comprises the layer of graphene 52 used to transfer electrons and the layer of compound semiconductor quantum dot 51 for electro-optical conversion.

The graphene/compound semiconductor quantum dot composites used in the second embodiment of the present invention can adopt the graphene/CdS quantum dot composites prepared by the method in accordance with the first embodiment of the present invention.

In another embodiment of the present invention, the compound semiconductor in the graphene/compound semiconductor quantum dot composites can be at least one compound semiconductor chosen from the group II-VI or group III-V compound semiconductors, for example, CdS, CdSe, CdTe, ZnS, ZnSe, ZnTe, InAs, InP, InSb, or AlSb.

Third Embodiment

The third embodiment of the present invention provides a method for manufacturing a light emitting diode comprising the light-emitting layer of graphene/compound semiconductor quantum dot composites. The method for example comprises:
1) depositing a transparent anode layer 11 on a substrate 100, for example, by sputtering, vapor plating, or spin coating, etc;
2) dissolving a graphene/compound semiconductor quantum dot composites and a hole transport layer material such as triphenyldiamine in an organic solvent such as toluene so as to obtain a mixture; and coating the surface of the transparent anode layer 11 with the mixture, for example by spin coating;
3) removing the solvent by heating, so as to form a hole transport layer 21 and an overlying light-emitting layer 60 of graphene/compound semiconductor quantum dot composites;
4) depositing an electron transport layer 31, for example, by sputtering, vapor plating, or spin coating, etc;
5) depositing a metal cathode 41, for example, by sputtering, vapor plating, or spin coating, etc.

In the above steps of preparing the hole transport layer (or the electron transport layer) and the light-emitting layer of graphene/compound semiconductor quantum dot composites, since the molecules of aromatic triphenyldiamine are small (about 1 nm), and the molecules of graphene/compound semiconductor quantum dot composites are relatively large (>3 nm) and covered by alkane chains, triphenyldiamine tends to locate beneath the light emitting layer of graphene/compound semiconductor quantum dot composites and above the transparent anode during the step of removing the solvent by heating.

Since the compound semiconductor quantum dot within the light emitting layer prepared by the method in accordance with the embodiment of the present invention, exists in single layer and has a relatively high density, the light emitting efficiency of the device is correspondingly high.

Figure 2:
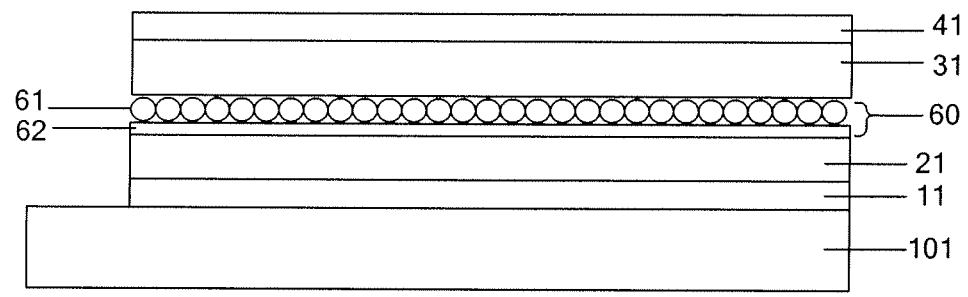
FIG. 2 is a schematic diagram showing light emitting diode manufactured in the third embodiment of the present invention.

Referring to FIG. 2, different from the second embodiment, the light emitting diode with a light emitting layer formed of graphene/compound semiconductor quantum dot composites manufactured by the method in accordance with the third embodiment comprises, from the bottom to the top, the substrate 101, the transparent anode 11, the hole transport layer 21, the light-emitting layer 60 formed of graphene/compound semiconductor quantum dot composites, the electron transport layer 31 and the metal cathode 41, wherein the light-emitting layer formed of graphene/compound semiconductor quantum dot composites comprises a quantum dot layer 61 and a graphene layer 62.

The substrate 101 can be made of materials such as glass, silica, metals, etc.

The metal cathode 41 can be made of materials such as Al, Ag, MgAg alloys, etc.

The electron transport layer 31 is used to transfer electrons to the light-emitting layer 60 of graphene/compound semiconductor quantum dot composites. The electron transport layer 31 can be made of inorganic oxide materials such as $ZnO$, $TiO_2$, $WO_3$ or $SnO_2$, or organic materials such as TPBI (1,3,5-Tris(N-phenyl benzimidazole-2-2 yl)benzene) or TAZ (3-(4-biphenyl)-4-phenyl-5-tert-butyl-phenyl-1,2 4-triazole).

The hole transport layer 31 is used to transfer holes to the light-emitting layer 60 of graphene/compound semiconductor quantum dot composites. The hole transport layer 21 can be made of organic materials such as CBP (4,4'-N,N'-dicarbazole-biphenyl), a-NPD (N,N'-Di-[(1-naphthalenyl)-N,N-diphenyl]-1,1'-biphenyl)-4,4'-diamine), TCCA (4,4',4"-Tris (N-azolyl)-triphenylamine) and DNTPD (N,N'-Bis(4-(N,N'-diphenyl-amino)phenyl)-N,N'-diphenylbenzidine), or inorganic materials such as NiO, $MoO_3$, etc.

The transparent anode 11 is a layer of indium tin oxide (ITO).

The light-emitting layer 60 of graphene/compound semiconductor quantum dot composites comprises the graphene layer 62 used to transfer electrons and the layer of compound semiconductor quantum dot 61 for electro-optical conversion. The compound semiconductor in the graphene/compound semiconductor quantum dot composites can be at least one compound semiconductor chosen from the group II-VI or group III-V compound semiconductors, for example CdS, CdSe, CdTe, ZnS, ZnSe, ZnTe, InAs, InP, InSb, or AlSb, etc.

In the embodiment of the present invention, the hole transport layer (or the electron transport layer) and the electroluminescent layer of graphene/compound semiconductor quantum dot composites are formed in the same step, so as to produce a electroluminescent layer of graphene/compound semiconductor quantum dot composite with a high density and electroluminescent efficiency.

In the embodiments of the present invention, the graphene/compound semiconductor quantum dot composites is used for the electroluminescent layer of the light-emitting diode, so that compound semiconductor quantum dots are used to achieve an electro-optical conversion due to the optical properties, and graphene is used to transfer charge due to the unique electronic properties, thereby improving the electro-optical conversion efficiency.

In the light emitting diode manufactured by the method in accordance with the embodiments of the present invention, the compound semiconductor quantum dots exist in the form of a single layer with high density, capable of achieving efficient and stable electroluminescence.

The light emitting diode in accordance with the embodiments of the present invention has an electroluminescent layer of graphene/compound semiconductor quantum dot composites, so as to improve the electro-optical conversion efficiency by using the compound semiconductor quantum dots to achieve a electro-optical conversion and using the graphene to transfer charge. Furthermore, in the embodiments of the present invention, since the hole transport layer (or the electron transport layer) and the electroluminescent layer of graphene/compound semiconductor quantum dot composites are formed in the same step, it is possible to produce an electroluminescent layer of graphene/compound semiconductor quantum dot composites with high density and electroluminescent efficiency.

Although the present invention has been described in considerable detail with reference to preferred embodiments thereof, some modifications or improvements can also be made on the basis of the present invention, which is evident to those skilled in the art. Therefore, those modifications or improvements, which are made without departing from the spirit of the present invention, all belong to the protection scope of the present invention.

What is claimed is:

1. A light emitting diode comprising;
   a substrate,
   a cathode,
   an electron transport layer,
   a electroluminescent layer,
   a hole transport layer and
   a transparent anode,
   wherein the electroluminescent layer is formed of a graphene/compound semiconductor quantum dot composite comprising graphene and quantum dots of a compound semiconductor, and wherein the electroluminescent layer comprises a layer of compound semiconductor quantum dots and a layer of graphene on said layer of compound semiconductor quantum dots.

2. The light emitting diode according to claim 1, wherein the quantum dots of the compound semiconductor exist in the form of a single layer.

3. The light emitting diode according to claim 1, wherein the compound semiconductor is any one selected from the group consisting of Cds, CdSe, CdTe, ZnS, ZnSe, ZnTe, InAs, InP, InSb and AlSb.

4. A method of manufacturing a light emitting diode according to claim 1, said method comprising the steps of:
   depositing a transparent anode layer on the substrate;
   dissolving the graphene/compound semiconductor quantum dot composite and a material for the hole transport layer in an organic solvent;
   coating the surface of the transparent anode with a mixture of the dissolved composite and material, and removing the solvent by heating so as to form the hole transport layer and the overlying electroluminescent layer formed of the graphene/compound semiconductor quantum dot composite;
   depositing the electron transport layer; and
   depositing a metal cathode layer.

5. The method according to claim 4, wherein the material for the hole transport layer is triphenyldiamine.

6. A method of manufacturing a light emitting diode according to claim 1, said method comprising the steps of:
   depositing a metal cathode layer on the substrate;
   depositing the electron transport layer;
   dissolving the graphene/compound semiconductor quantum dot composite in an organic solvent so as to obtain a mixture;
   coating a surface of the electron transport layer with the mixture, removing the solvent by heating so as to form the electroluminescent layer of the graphene/compound semiconductor quantum dot composite;
   depositing the hole transport layer; and
   depositing the transparent anode layer.

\* \* \* \* \*